United States Patent
McCaffrey et al.

(10) Patent No.: US 10,830,357 B2
(45) Date of Patent: Nov. 10, 2020

(54) SINGLE CRYSTAL GRAIN STRUCTURE SEALS AND METHOD OF FORMING

(71) Applicant: UNITED TECHNOLOGIES CORPORATION, Farmington, CT (US)

(72) Inventors: Michael G. McCaffrey, Windsor, CT (US); Jeffrey M. Wittman, Wells, ME (US); Dilip M. Shah, Glastonbury, CT (US); Alan D. Cetel, West Hartford, CT (US); Timothy M. Davis, Kennebunk, ME (US); Mark J. Rogers, Kennebunk, ME (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 0 days.

(21) Appl. No.: 14/695,981

(22) Filed: Apr. 24, 2015

(65) Prior Publication Data

US 2016/0312894 A1 Oct. 27, 2016

(51) Int. Cl.
*F16J 15/08* (2006.01)
*B21B 1/46* (2006.01)
(Continued)

(52) U.S. Cl.
CPC ............ *F16J 15/0887* (2013.01); *B21B 1/46* (2013.01); *C30B 11/14* (2013.01); *C30B 29/52* (2013.01);
(Continued)

(58) Field of Classification Search
CPC ..... F16J 15/0887; F16J 15/062; F01D 11/005
See application file for complete search history.

(56) References Cited

U.S. PATENT DOCUMENTS 3,572,734 A * 3/1971 Holt ..................... F16J 15/3236
277/556
3,909,076 A * 9/1975 Kato .................... F16J 15/3456
277/363
(Continued)

FOREIGN PATENT DOCUMENTS

EP 0475428 A1 3/1992
EP 1593757 A1 11/2005
(Continued)

OTHER PUBLICATIONS

European Search Report for Application No. 16166894.2; dated: Sep. 12, 2016, 5 pages.

*Primary Examiner* — Eugene G Byrd
(74) *Attorney, Agent, or Firm* — Cantor Colburn LLP

(57) ABSTRACT

The present disclosure relates to advanced materials, particularly single crystal grain structures including the formation of single crystal grain structures. Single crystal grain structures offer improved mechanical properties when used with individual components. Improving mechanical properties is favorable for components that are used in applications with high temperature, pressure, and stress. In these applications, mechanical failure is extremely undesirable. Individual components, such as seals, can be designed with a single crystal grain structure in a preferred direction. By selecting a preferred direction, and orienting the single crystal grain structure accordingly, the single crystal grain structure can improve the component's mechanical properties. Single crystal grain structure seals and the method of forming the seals, therefore, offer various improvements to individual components, specifically when the components are designed for high temperature, pressure, and stress applications.

17 Claims, 5 Drawing Sheets

(51) Int. Cl.
  *F01D 11/00* (2006.01)
  *C30B 33/00* (2006.01)
  *C30B 29/52* (2006.01)
  *C30B 11/14* (2006.01)
  *F16J 15/02* (2006.01)

(52) U.S. Cl.
  CPC ............ *C30B 33/00* (2013.01); *F01D 11/005* (2013.01); *F16J 15/022* (2013.01); *F05D 2220/32* (2013.01); *F05D 2240/55* (2013.01); *F05D 2300/607* (2013.01); *Y02T 50/671* (2013.01)

(56) References Cited

U.S. PATENT DOCUMENTS

| | | | | |
|---|---|---|---|---|
| 4,784,397 A | * | 11/1988 | Tozer | F16J 15/0887 277/644 |
| 6,199,871 B1 | * | 3/2001 | Lampes | F01D 11/005 277/614 |
| 7,938,407 B2 | * | 5/2011 | Datta | F16J 15/0887 277/644 |
| 2005/0057003 A1 | * | 3/2005 | Iguchi | F16J 15/0887 277/591 |
| 2005/0082768 A1 | * | 4/2005 | Iguchi | F01D 11/005 277/591 |
| 2005/0206097 A1 | * | 9/2005 | Datta | F16J 15/3212 277/644 |
| 2008/0106046 A1 | * | 5/2008 | Datta | F16J 15/0887 277/644 |
| 2008/0187430 A1 | * | 8/2008 | Datta | H01L 21/67126 414/805 |
| 2010/0072710 A1 | * | 3/2010 | Morgan | F01D 9/042 277/399 |
| 2012/0195743 A1 | * | 8/2012 | Walunj | F01D 11/006 415/174.5 |
| 2012/0235366 A1 | * | 9/2012 | Walunj | F01D 5/3007 277/647 |
| 2013/0113168 A1 | * | 5/2013 | Lutjen | F01D 11/005 277/644 |
| 2015/0354389 A1 | * | 12/2015 | Pack | F01D 11/008 416/204 A |
| 2016/0003078 A1 | * | 1/2016 | Stevens | F01D 11/005 277/647 |

FOREIGN PATENT DOCUMENTS

| | | |
|---|---|---|
| EP | 1878873 A2 | 1/2008 |
| WO | 2015089431 A1 | 6/2015 |

* cited by examiner

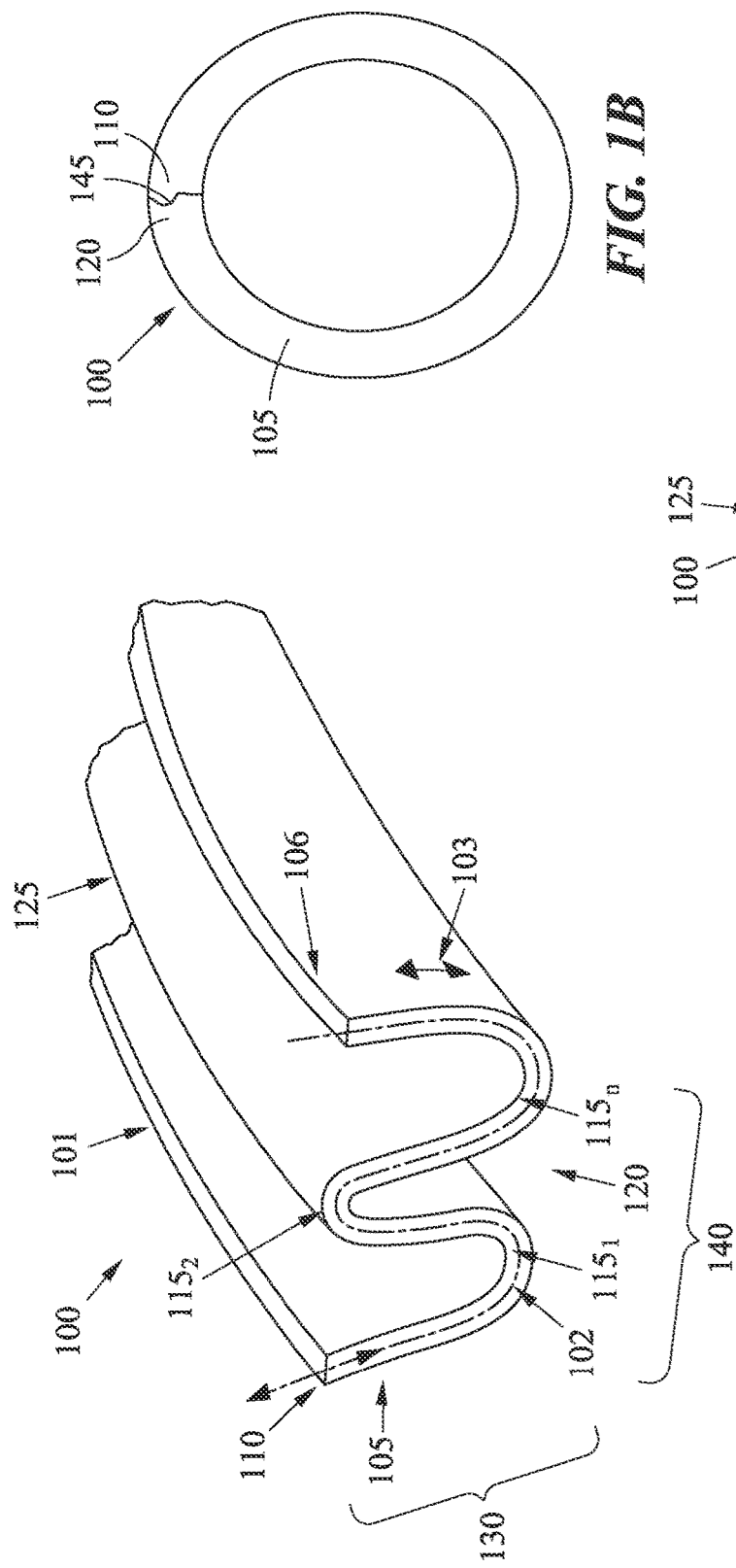
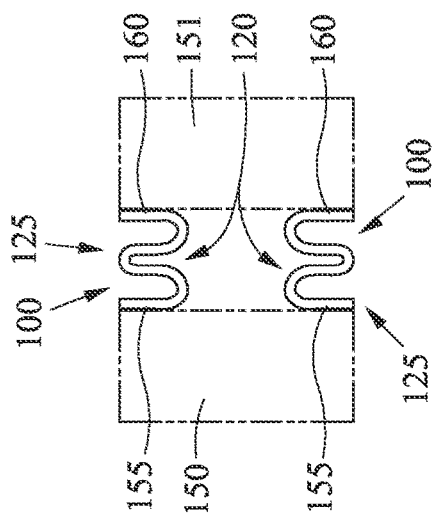
FIG. 1A
FIG. 1B
FIG. 1C

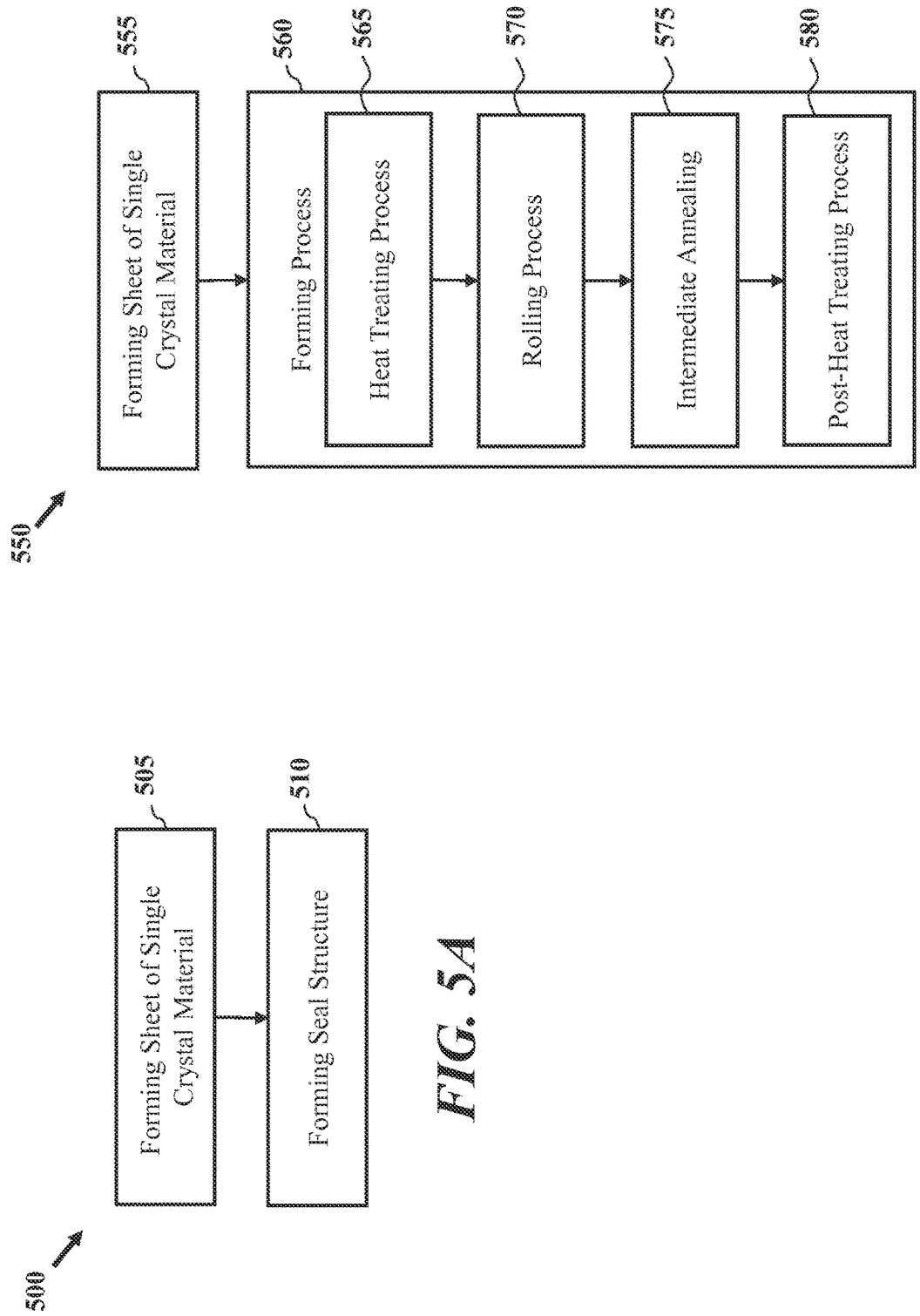

SINGLE CRYSTAL GRAIN STRUCTURE SEALS AND METHOD OF FORMING

FIELD

The present disclosure relates to advanced materials, particularly single crystal grain structures including the formation and use of single crystal grain structures.

BACKGROUND

Advanced technology systems, such as gas turbine engines used in modern aircraft and sea vessels, in power generation operations, and in industrial applications, operate in environments with extremely high temperatures and pressures. Under these extreme conditions, many of the components within these advanced technology systems experience creep: a physical deformation of the components due to any combination of time, temperature, and stress. Creep can ultimately lead to mechanical failure of the components.

Accordingly, there is a desire to provide components that operate at high temperatures and pressures while simultaneously resisting the harmful effects of creep.

BRIEF SUMMARY OF THE EMBODIMENTS

Disclosed and claimed herein are single crystal grain structure seals. One embodiment is directed to a seal. The seal includes a leading edge and a trailing edge. The seal further includes a seal body between the leading edge and the trailing edge. The seal body has a cross-sectional shape. The seal body is formed of a single crystal grain structure, the single crystal grain structure oriented in a direction following the cross-sectional shape of the seal body.

Another embodiment is directed to a single crystal grain structure seal. The single crystal grain structure seal includes a first end and a second end. The seal further includes a cross-sectional shape. The cross-sectional shape is a two-dimensional shape represented by a cross-section of the single crystal grain structure seal. This cross-sectional shape is substantially the same at the first end, the second end, and a plurality of locations along the single crystal grain structure seal between the first end and the second end. The single crystal grain structure seal further includes a single crystal grain structure direction. The single crystal grain structure direction is directed along the cross-sectional shape, such that the single crystal grain structure direction is configured in the same direction as the cross-sectional shape.

Another embodiment is directed to a method of forming a single crystal grain structure seal. The method includes melting a crystalline material. The method further includes casting a single crystalline bar. The single crystalline bar is cast from the crystalline material and a seed. The seed has a desired crystalline orientation, such that the single crystalline bar is cast with the desired crystalline orientation. The method further includes rolling the single crystalline bar, or a cut section thereof into a single crystalline sheet through warm working at a desired temperature. The method further includes rolling the single crystalline sheet in an extrusion direction to create a cross-sectional shape. The cross-sectional shape has a single crystal grain structure direction. This single crystal grain structure direction is directed along the cross-sectional shape, such that the single crystal grain structure direction is configured in the same direction as the cross-sectional shape.

In one embodiment, the seal is a circumferential seal.

In one embodiment, the seal is a W-seal for a gas turbine engine.

In one embodiment, the cross-sectional shape of the seal includes a plurality of bends.

In one embodiment, the cross-sectional shape of the seal includes at least one of a trough and a ridge between the trailing edge and leading edge.

In one embodiment, the single crystal grain structure includes facet orientation.

In one embodiment, the seal is formed of a precipitation hardened nickel based super alloy with more than 5% weight aluminum or more than 50% by volume of the precipitates if aluminum is added in combination with elements such as titanium, tantalum, or nibobium to form precipitates.

In one embodiment, the seal body is configured with a uniform thickness.

In one embodiment, the maximum exposure temperature is within the range of 1200° F. to 2000° F. (650° C. to 1100° C.).

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIGS. 1A-1C depict graphical representations of a seal with a single crystal grain structure direction according to one or more embodiments;

FIGS. 5A-5B depict processes for forming a seal according to one or more embodiments.

DETAILED DESCRIPTION OF THE EXEMPLARY EMBODIMENTS

Overview and Terminology

Figure 2:
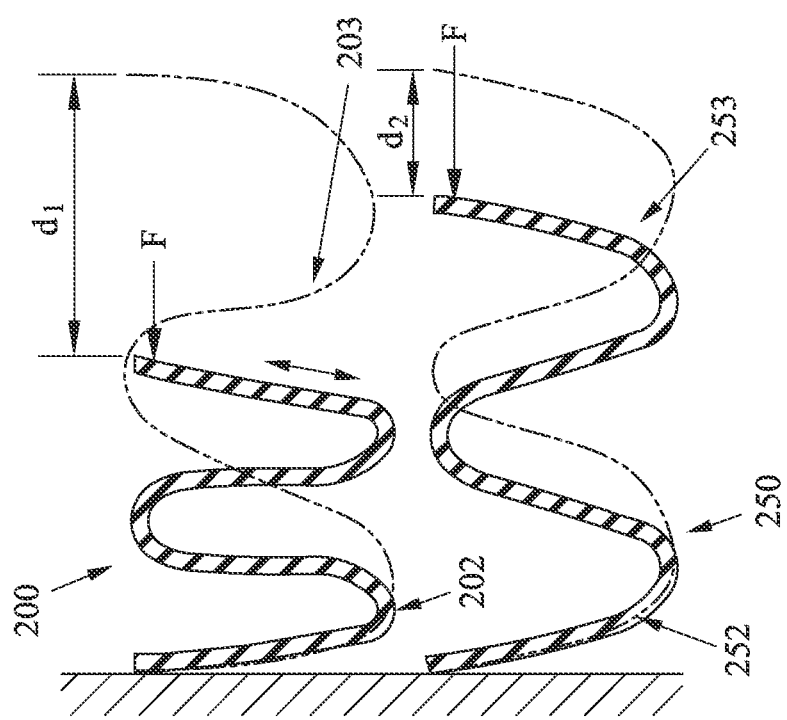
FIG. 2 depicts the deflection of a seal with a reduced modulus of elasticity according to one or more embodiments.

One aspect of this disclosure relates to components for gas turbine engines, and in particular, sealing components. According to one embodiment, a seal is provided having a single crystal grain structure. According to another embodiment, the seal is configured with the single crystal grain structure oriented with the cross-sectional shape of the seal. As used herein, a single crystal grain structure relates to a cast single crystal with dendritic structure and occasional grain defects with grain misorientation preferably less than 8° but no more than 15° in non-critical locations. Another aspect of this disclosure relates to a method of forming a single crystal grain structure, and in particular single crystal seals, such that the single crystal grain structure seal is produced in a desired shape. By providing a single crystal seal in a desired shape, such that the single crystal grain structure is in a desired direction, the single crystal seal will have inherently different material characteristics, such as Young's modulus, than a multi-crystal seal made of the same material. Thus, it is desirable to form single crystal grain structures in a desired shape and direction.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

Referring now to the figures, FIGS. 1A-1C depict graphical representations of a seal according to one or more embodiments. Referring first to FIG. 1A, a partial representation is shown of a portion of a seal 100. The seal 100 has an inner diameter 120, an outer diameter 125, a height 130, and a width 140. The seal 100 includes leading edge 105 and trailing edge 106. The seal further includes a seal body 101 between the leading edge 105 and the trailing edge 106. The seal further includes a plurality of bends $115_{1-n}$ disposed between the leading edge 105 and the trailing edge 106. The plurality of bends $115_{1-n}$ can be any one of a trough, ridge, or other geometric profile. The seal body 101 has a cross-sectional shape 102. The seal body 101 is formed of a single crystal grain structure, the single crystal grain structure oriented in a single crystal grain structure direction 103 following the cross-sectional shape 102 of the seal body.

In a preferred embodiment, the cross-sectional shape 102 is a two-dimensional shape represented by a cross-section of the seal 100, such that the cross-sectional shape 102 is substantially the same at the first end 110, the second end 120, and a plurality of locations along the seal 100 between the first end 110 and the second end 120. The seal 100 also has a single crystal grain structure direction 103, the single crystal grain structure direction 103 directed along the cross-sectional shape 102 such that the single crystal grain structure direction 102 is configured in the same direction as the cross-sectional shape 102.

In the single crystal grain structure direction 103, the grain structure has one crystal, with a very distinct orientation of atoms. The distinct orientation of atoms, thus, affects the mechanical properties of the crystalline material. For instance, a single crystal grain structure direction 103 can affect the stiffness of a crystalline material. Stiffness is also often represented as the Young's modulus of the material. With a single crystal grain structure direction 103, the Young's modulus of the material is reduced. This Young's modulus is dictated by the distinct orientation of the atoms associated with the single crystal grain structure direction 103. For sealing elements, a reduced Young's modulus is desirable; this desirability is described in more detail below with reference to FIG. 2.

In a preferred embodiment, the material of the seal 100 is a precipitation hardened nickel based super alloy with more than 5% weight aluminum. In a different embodiment, the precipitation nickel based super alloy has more than 50% by volume of the precipitates if aluminum is added in combination with elements such as titanium, tantalum, or niobium to form the precipitates.

In one embodiment, the maximum exposure temperature is within the range of 1200° F. to 2000° F. (650° C. to 1100° C.).

While FIG. 1 depicts a seal 100 with a cross-sectional shape 102 of a "W," the seal can be of any shape for the application in which it is used. The shape of the seal is application-specific. In other embodiments, the cross-sectional shape 102 of the seal can be an O-shape, a C-shape, a Diamond-shape, a Dogbone-shape, a Feather-shape, a Bathtub-seal shape, a Wire-seal shape, or any other geometric shape.

In an embodiment, the first end 110 of the seal 100 may interface with a second end (not shown in FIG. 1A) of seal 100.

FIG. 1B depicts a graphical representation of the seal 100 from an axial or perspective view. This view includes the leading edge 105. In an embodiment, the first end 110 may be joined or fused to a second end 120 in region 145. The joining or fusing could be by any common means, such as adhesive, welding, additional mechanical fasteners, or any other common form of joining or fusing. Alternatively, one or more joint elements may be employed, as described in more detail below with reference to FIG. 3.

FIG. 1C depicts a cut-away representation of the seal 100, when disposed between components, such as components of a gas turbine engine. In this cut-away representation, the seal 100 is depicted in two separate orientations. In this embodiment, there is a first component 150 and a second component 151. The seal 100 is disposed between the first component 150 and the second component 151. The seal 100 is in contact with the first component at a first contact point 155. The seal 100 is in contact with the second component 151 at a second contact point 160. Contact with the first component 150 and the second component 151 thus forms a complete seal between the two components.

In a preferred embodiment, the seal is designed to fill an existing gap between two components, and the seal would deflect and compress a certain amount. Sealing can be more difficult if either of the two contact points are not oriented such that a uniform gap exists. In other words, the seal might not be "flush" or level between the two contact points. To remedy this problem, a softer or more flexible material is desirable for a seal. A more flexible seal will deflect more, and tolerate a greater range of motion. A more flexible seal will also have a higher endurance, because there is a lower resulting stress in the seal. Another advantage is more translation of the seal before reaching the seal's critical stress. By controlling the crystalline direction of the seal, the Young's Modulus can be controlled, effectively allowing for seals that can handle more deflection. Furthermore, using a material such as a nickel super alloy for the seal material, with the desired crystalline orientation, can reduce the stresses in the seal. Making the same seal with a standard nickel alloy material, the stresses would by 50% higher. Finally, these seals can have improved wear resistance, oxidation resistance, resistance to creep, and a number of other added benefits.

A durable and flexible seal is desirable, because the seal will no longer be the limiting component of the apparatus in which the seal is used. For these reasons, it is desirable that a seal properly deals with: high temperature, creep, stress rupture, wear resistance, oxidation resistance, overall compatibility, and coefficient of thermal expansion, among other factors.

FIG. 2 depicts the deflection of a first seal 200 with a reduced modulus of elasticity. The first seal 200 has a first cross-sectional shape 202. The first cross-sectional shape 202 is a two-dimensional shape represented by a cross-section of the first seal 200. The first seal 200 also has a first crystal grain structure direction 203, which is a single crystal grain structure direction. This first crystal grain structure direction 203 is directed along the first cross-sectional shape 202 such that the first crystal grain structure direction 203 is configured in the same direction as the first cross-sectional shape 202. FIG. 2 also depicts the deflection of a second seal 250. The second seal 250 has a second cross-sectional shape 252. The second cross-sectional shape 252 is a two-dimensional shape represented by a cross-section of the second seal 250. The second seal 250 also has a second crystal grain structure direction 253. This second crystal grain structure direction 253 is not a single crystal grain structure direction like that of the first seal 202. The second crystal grain structure direction 253 is not configured in the same direction as the second cross-sectional shape 252.

In one particular embodiment, the crystalline material associated with a first seal 202 and a second seal 250 is a nickel super alloy. The first seal 202 has a first crystal grain structure direction 203, which is a single crystal grain structure direction. For single crystal nickel super alloys, the Young's modulus of the material is approximately 18 million pounds-per square inch (PSI) (e.g., 12.4 million Newtons per square centimeter ($N/cm^2$)) in one crystalline direction at room temperature. In other directions, alternatively, the Young's modulus can be higher. In a second crystalline orientation 253, not configured in the same direction as the second cross-sectional shape 252, the Young's modulus can be approximately 28-32 million PSI (e.g., 19.3 million-22 million $N/cm^2$) at room temperature. Thus, the Young's modulus in the second crystal grain structure direction 253 can be much higher than the Young's modulus in the first crystal grain structure direction 203. While the Young's moduli are different, both the first seal 202 and the second seal 250 involve the same material, a nickel super alloy. Therefore, different crystalline directions 203/253 can yield different Young's moduli for the same material. In other words, certain crystalline directions can be "stiffer" than other crystalline directions for the same crystalline material. For a "stiffer" material, with a higher Young's modulus, the material will deflect less. Alternatively, with a lower Young's modulus is, the material will deflect more.

Generally, improving a component's material characteristics such, as Young's modulus, ductility, wear resistance, and oxidation resistance could reduce the likelihood of creep, thus reducing the likelihood of mechanical failure. At the same time, a component must operate within an overall system. For instance, while strength may be desirable for a material generally, flexibility may also be desirable for the system in which the material is being used. For this reason, an individual component's material characteristics must be optimized. One way of optimizing a material's inherent characteristics is to control the crystalline structure of the material. Use of a single crystalline structure, and a desired crystalline orientation, can improve a component's material characteristics within an advanced technology system.

With a sealing element, a lower Young's is often desirable. One of a seal's purposes is to contact a surface. If a seal is rigid, it might not form as complete of a seal. Reducing the seal's Young's modulus could allow for a seal to deflect substantially more. In a preferred embodiment, the reduced Young's Modulus due to crystalline orientation would allow for a seal to deflect an additional 25-50%, thus providing a much better seal.

At the same time, flexibility and ductility in materials can often mean that the material is "weaker" to external forces. While flexibility is a desirable mechanical property for seals, there are other desirable mechanical properties: such as stability, wear resistance, and oxidation resistance. These other desirable mechanical properties become more and more crucial as the seal is used in components at high temperatures and pressures.

For instance, many conventional seals will begin to creep, or deform, at high temperatures. In temperatures such as 1500° F. to 1700° F. (e.g., in the range of 800° C. to 900° C.) and higher, the creep can even lead to stress rupture and mechanical failure. A single crystalline structure, alternatively, has useful high strength into the 1800° F. range (e.g., into the 985° C. range); it is more resistive to creep. Also, many conventional materials are undesirable at high temperatures due to oxidation problems. For example, Titanium has a lower Young's modulus than a nickel super alloy. In other words, Titanium is generally more flexible than a nickel super alloy. That being said, above 1000° F. (e.g., above 535° C.) Titanium reacts with oxygen to produce a brittle scale. Thus, being able to reduce the Young's modulus of a crystalline material to make the crystalline material more flexible, through the orientation of a crystalline structure in a desired crystalline direction, while simultaneously employing a crystalline material that has other desirable mechanical properties, is extremely beneficial for the engineering of high temperature and high pressure systems. By optimizing a material's mechanical properties, the seal would no longer be the limiting component of the apparatus. From a wear standpoint, a more wear resistant seal means fewer repairs for the apparatus in which it is used. These improvements give greater operational use to current materials and designs.

In a preferred embodiment, the seal is a W-seal and has a single crystal grain structure direction and a cross-sectional shape that is in the form of a W-shape. Because the W-shape seal has multiple bends along its cross-section, the seal has multiple opportunities for deflection. Varying deflection means there is a varying bending stress throughout in the W-seal's cross-sectional plane. Similar to wood veneer, which easily bends in the direction across the grain, the W-seal is anisotropic in an atomic manner. This atomic manner is dictated by the single crystal grain structure direction of the seal. The result of this is that one direction can bend or deflect more easily, while one direction is stiffer and harder to bend or deflect.

In one embodiment as previously discussed, the seal is a complete circumferential seal. That is, the seal has a first end and a second end, and the first end and the second end contact one another, such that the seal forms a complete circle. In other embodiments, the seal is not a complete circumferential seal, but instead a half-circle, or even a straight piece.

Figure 3:
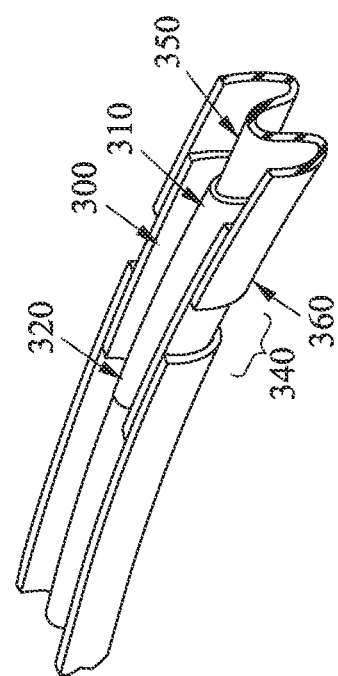
FIG. 3 depicts a layered split-seal according to one or more embodiments.

FIG. 3 depicts a layered split-seal 300. The layered split-seal 300 has a first end 310 and a second end 320. The first end 310 and second end 320 do not contact one another. In other words, the layered split-seal 300 does not form a complete circumference. The layered split-seal 300 can be layered on top of a second layered split-seal 350. Layering seals can prevent a gap 340 created by an end 360 of a second layered split-seal 350 by covering the gap 340. Furthermore, the layered split-seal 300 and the second layered split-seal 350 can be joined or fused. The joining or fusing could be by any common means, such as adhesive, welding, additional mechanical fasteners, or any other common form of joining or fusing In an embodiment, the seal is used to seal a gap between a first component and a second component. In an alternate embodiment, the first component has a plurality of first sub-components, and the second component has a plurality of second sub-components. The first sub-components and second sub-components may not be "flush" with one another. In other words, gaps may exist between the first component and the second component, and between individual first sub-components and individual second sub-components. For this reason, a flexible seal is desirable. A flexible seal that provides for deflection will serve as a better sealing element between the first component and the second component.

In an alternate embodiment, the plurality of first sub-components is a plurality of segmented vanes. The plurality of second sub-components is a plurality of segmented boas. The seal is used to seal a gap between the plurality of segmented vanes and the plurality of segmented boas. As previously discussed, the W-seal is one of a plurality of seal designs that can be used. The W-seal has a single crystalline direction, along the cross-sectional direction of the seal itself. When a W-seal is used between the plurality of segmented vanes and the plurality of segmented boas, to seal the gap, the top side of the W can deflect as the seal is contacted by the surfaces of the plurality of segmented vanes and the plurality of segmented boas. This W-seal allows for an improved sealing of the gap across the components.

Figure 4A:
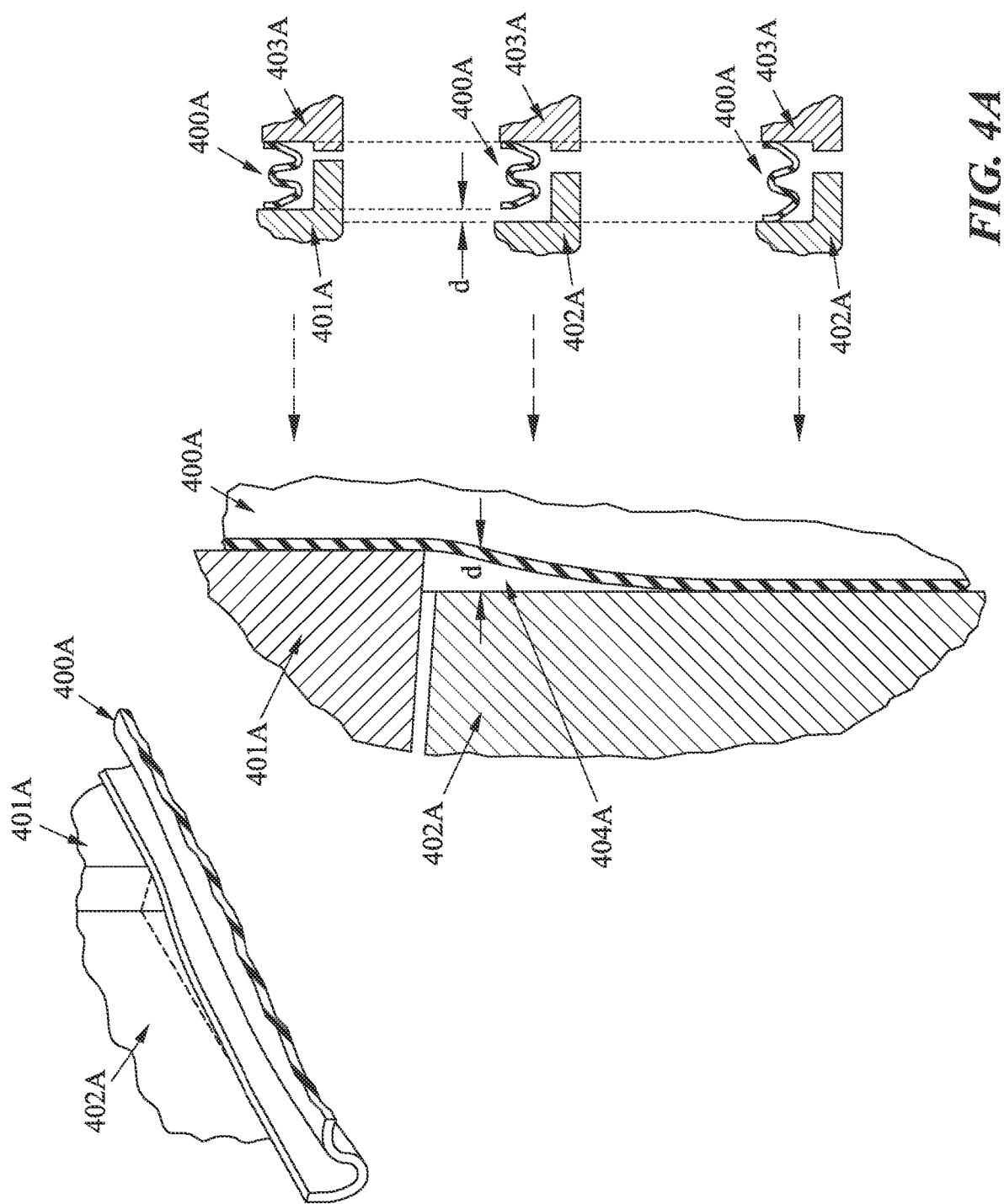
FIG. 4A depicts the use of a seal between a plurality of vanes and air seal according to one or more embodiments.

FIG. 4A depicts the use of a seal between a plurality of vanes and an air seal. An analysis is done to assess the plurality of anticipated stresses between a first component and a second component. In one embodiment, the first component is a plurality of segmented vanes 401A/402A and the second component is a plurality of segmented boas 403A. Preferably, the plurality of segmented boas 403A is an air seal. The seal 400A, including the cross-sectional shape of the seal, is selected based on the plurality of anticipated stresses. The seal 400A is oriented in a preferred orientation between the plurality of segmented vanes 401A/402A and the plurality of segmented boas 403A. The seal 400A is then inserted into a gap 404A between the plurality of segmented vanes 401A/402A and the plurality of segmented boas 403A. Upon insertion, the seal 400A reduces the ability of a fluid to flow through the gap 404A.

Figure 4B:
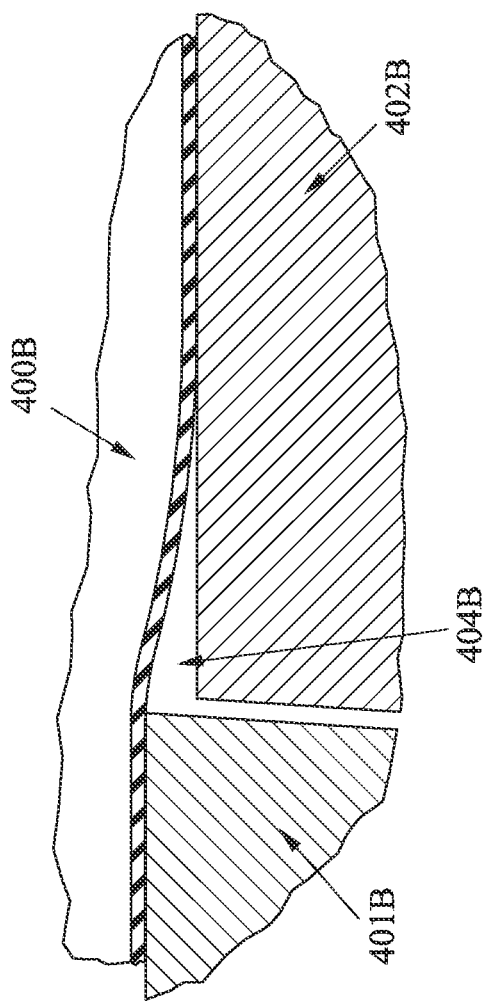
FIG. 4B depicts seal deflection to seal a gap according to one or more embodiments.

FIG. 4B depicts a seal deflection to seal a gap. The seal 400B is designed to seal a gap 404B between a first vane 401B and a second vane 402B and a secondary component (not pictured). The first vane 401B and the second vane 402B are not "flush." In other words, a gap 404B exists. For this reason, a flexible seal is desirable. A flexible seal, such as the seal 400B, which provides for enhanced deflection will serve as a better sealing element for the gap 404B between the first vane 401B and the second vane 402B and a secondary component (not pictured).

FIGS. 5A-5B depict processes for forming a seal according to one or more embodiments. FIG. 5A depicts process 500 including forming a sheet of single crystal material at block 505. In an embodiment, this sheet of single crystal material is created by investment casting, using directional solidification. The single crystal material is preferably a precipitation hardened nickel based super alloy with more than 5% weight aluminum, or more than 50% by volume of the precipitates if aluminum is added in combination with elements such as titanium, tantalum, or nibobium to form the precipitates. The resulting casting preferably has single crystal grain structure direction parallel to the direction of solidification. With particular cross-sections, it is often helpful to seed the casting with a property selected crystal seed. Use of a seed ensures that the faces of the ingot are also cube directions. Once an ingot is cast, it is usually sliced. Slicing can be done with single or multiple wire EDM, abrasive means, or any other cutting mechanism. The result of the cutting process is a thin section of single crystal material having a desirable transverse crystallographic direction.

At block 510, a seal structure, such as the seal structure described above may be formed. The forming process for the thin section of single crystal material can take place in an as-cast, or a heat treated, condition. The thin section is mechanically formed, such that the desired seal structure results. In a preferred embodiment, the thin section is mechanically formed at block 510 such that the cross-sectional shape is a W-shape.

FIG. 5B depicts a preferred approach for forming a seal. The process 550 includes forming a sheet of single crystal material at block 555. In an embodiment, this sheet of single crystal material is created by investment casting, using directional solidification. The single crystal material is preferably a precipitation hardened nickel based super alloy with more than 5% weight aluminum. The resulting casting preferably has single crystal grain structure direction parallel to the direction of solidification. With particular cross-sections, it is often helpful to seed the casting with a property selected crystal seed. Use of a seed ensures that the faces of the ingot are also cube directions. Once an ingot is cast, it is usually sliced. Slicing can be done with single or multiple wire EDM, abrasive means, or any other cutting mechanism. The result of the cutting process is a thin section of single crystal material having a desirable transverse crystallographic direction.

Starting at block 560, a seal structure, such as the seal structure described above may be formed. The forming process 560 requires that the thin section of single crystal material is rolled to be formed. This rolling process reduces the thin section of single crystal material to a desired thickness while simultaneously improving the fatigue response. Typically, the forming process at block 560 requires that the thin section of single crystal material is solution heat treated and subsequently slow cooled at block 565. This heat treating process allows for a coarsening of precipitates, such that the thin section of single crystal material becomes softer. Such softened material is then rolled at block 570. At block 570, during the rolling process, the temperature is controlled such that the temperature of the thin section of single crystal material is below the recrystallization temperature of the alloy. In an embodiment, this temperature is estimated at approximately 85% of the solution temperature, expressed on an absolute scale. The rolling process at block 570 can result in any desired shape for the thin section of single crystal material. The forming process at block 560 must take place gradually, to avoid overstressing the thin section of single crystal material. For this reason, the forming process at block 560 could be repeated a number of times before the desired shape is created.

Additionally, and depending on the starting and ending thicknesses, length requirements, and desired shape, a number of treating processes may be required within the forming process at block 560. These treating processes could include a pre-heat treatment process at block 565, intermediate annealing treatment after the rolling process at block 575, and a post-heat treatment at block 580.

In an alternate embodiment, if the length of the thin section of single crystal material is such that furnace sizing is an issue, the single crystal ingot could be spiral cast and subsequently spiral cut to length.

In a preferred embodiment, the thin section of single crystal material undergoes the rolling process at block 570 such that the resulting desired shape is a W-shape. With this resulting W-shape, a single crystal grain structure direction is in the shape of the "W." The crystal would follow curvature of the "W," along the cross-sectional shape of the seal, such that the single crystal grain structure follows the W-profile. The entire "W" would be in a single crystal grain structure direction.

In another embodiment, the sheet can be rolled at block 570 such that the cross-sectional shape of the seal can be an O-shape, a C-shape, a Diamond-shape, a Dogbone-shape, a Feather-shape, a Bathtub-seal shape, a Wire-seal shape, or any other geometric shape. The rolling process can create any shape for the individual application in which the seal is being used.

While this disclosure has been particularly shown and described with references to exemplary embodiments thereof, it will be understood by those skilled in the art that various changes in form and details may be made therein without departing from the scope of the claimed embodiments.

What is claimed is:

1. A seal comprising:
   a leading edge;
   a trailing edge; and
   a seal body having a plurality of bends between the leading edge and the trailing edge, wherein the seal body has a cross-sectional shape having bends, and wherein the seal body is formed of a sheet of material having a single crystal grain structure, the single crystal grain structure oriented in a crystallographic direction following the bends of the cross-sectional shape of the seal body.

2. The seal of claim 1, wherein the seal is a circumferential seal.

3. The seal of claim 1, wherein the seal is a W-seal for a gas turbine engine.

4. The seal of claim 1, wherein the cross-sectional shape of the seal includes at least one of a trough and a ridge between the trailing edge and leading edge.

5. The seal of claim 1, wherein the single crystal grain structure includes facet orientation.

6. The seal of claim 1, wherein the seal is formed of a precipitation hardened nickel based super alloy with more than 5% weight aluminum, or more than 50% by volume of the precipitates if aluminum is added in combination with elements such as titanium, tantalum or niobium to form the precipitates.

7. The seal of claim 1, wherein the seal body is configured with a uniform thickness.

8. The seal of claim 1, wherein maximum exposure temperature is within a range of 650° C. to 1100° C.

9. The seal of claim 1, wherein the cross-sectional shape of the seal is configured to deflect in an axial direction of the seal.

10. A single crystalline seal, the single crystalline seal comprising:
    a sheet of material having a first end;
    a second end;
    a cross-sectional shape, the cross-sectional shape being a two-dimensional shape having a plurality of bends and represented by a cross-section of the single crystalline seal, such that the cross-sectional shape is substantially the same at the first end, the second end, and a plurality of locations along the single crystalline seal between the first end and the second end; and
    a single crystal grain structure direction, the single crystal grain structure direction directed along the bends of the cross-sectional shape, such that the single crystal grain structure direction is configured in the same direction as the bends of the cross-sectional shape.

11. The single crystalline seal of claim 10, wherein the first end and the second end are connected, such that the single crystalline seal forms a circular shape from the first end to the second end.

12. The single crystalline seal of claim 10, wherein the cross-sectional shape is a W-shape.

13. A method of forming a single crystal grain structure seal, the method comprising:
    melting a crystalline material;
    casting a single crystalline bar, the single crystalline bar being cast from the crystalline material and a seed, the seed having a desired crystalline orientation, such that the single crystalline bar is cast with the desired crystalline orientation;
    rolling the single crystalline bar into a single crystalline sheet through warm working at a desired temperature; and
    rolling the single crystalline sheet in an extrusion direction to create a cross-sectional shape having a plurality of bends,
    wherein the cross-sectional shape has a single crystal grain structure direction, the single crystal grain structure direction directed along the cross-sectional shape, such that the single crystal grain structure direction is configured in the same direction as the cross-sectional shape.

14. The method of claim 13, wherein the crystalline material is a precipitation hardened nickel based super alloy with more than 5% weight aluminum, or more than 50% by volume of the precipitates if aluminum is added in combination with elements such as titanium, tantalum or niobium to form the precipitates.

15. The method of claim 13, wherein the cross-sectional shape is formed such that a cross-section of the cross-sectional shape is a W-shape.

16. The method of claim 13, wherein the rolling process further includes at least one of a pre-heat treating process, intermediate annealing process, and post-heat treating process.

17. The method of claim 16, wherein the rolling process is repeated more than one time to limit the reduction rate, in order to avoid overstressing the resulting single crystal grain structure.

* * * * *